United States Patent
Mouli et al.

(10) Patent No.: US 8,207,016 B2
(45) Date of Patent: Jun. 26, 2012

(54) METHODS OF COOLING SEMICONDUCTOR DIES

(75) Inventors: Chandra Mouli, Boise, ID (US); Gurtej S. Sandhu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 12/855,562

(22) Filed: Aug. 12, 2010

(65) Prior Publication Data

US 2010/0302740 A1    Dec. 2, 2010

Related U.S. Application Data

(62) Division of application No. 12/356,384, filed on Jan. 20, 2009, now Pat. No. 7,795,725, which is a division of application No. 11/370,093, filed on Mar. 6, 2006, now Pat. No. 7,494,910.

(51) Int. Cl.
    *H01L 21/00*      (2006.01)
(52) U.S. Cl. .......................... 438/108; 257/678; 438/599
(58) Field of Classification Search .................. 438/108, 438/599; 257/678; 378/199; 250/441.11; 977/742; 361/704
See application file for complete search history.

(56) References Cited

U.S. PATENT DOCUMENTS

| | | | |
|---|---|---|---|
| 5,650,662 A * | 7/1997 | Edwards et al. .............. | 257/700 |
| 6,670,699 B2 * | 12/2003 | Mikubo et al. ................ | 257/678 |
| 7,050,303 B2 * | 5/2006 | Park et al. ..................... | 361/715 |
| 2002/0185718 A1 * | 12/2002 | Mikubo et al. ................ | 257/678 |
| 2003/0117770 A1 | 6/2003 | Montgomery et al. | |
| 2003/0151896 A1 | 8/2003 | Zeighami et al. | |
| 2004/0005736 A1 | 1/2004 | Searls et al. | |
| 2004/0194944 A1 | 10/2004 | Hendricks et al. | |
| 2004/0261987 A1 | 12/2004 | Zhang et al. | |
| 2005/0046017 A1 | 3/2005 | Dangelo | |
| 2005/0061496 A1 | 3/2005 | Matabayas, Jr. | |

(Continued)

FOREIGN PATENT DOCUMENTS

WO   PCT/US2007/005209     10/2007

(Continued)

OTHER PUBLICATIONS

Javey, Ali, et al. "Electrical properties and devices of large-diameter single-walled carbon nanotubes" Feb. 11, 2002, pp. 1064-1066, vol. 80, No. 6, Applied Physics Letters.

(Continued)

*Primary Examiner* — Fernando L Toledo
(74) *Attorney, Agent, or Firm* — Wells St. John P.S.

(57) ABSTRACT

The invention includes semiconductor packages having grooves within a semiconductor die backside; and includes semiconductor packages utilizing carbon nanostructures (such as, for example, carbon nanotubes) as thermally conductive interface materials. The invention also includes methods of cooling a semiconductor die in which coolant is forced through grooves in a backside of the die, and includes methods of making semiconductor packages.

9 Claims, 10 Drawing Sheets

U.S. PATENT DOCUMENTS

| | | |
|---|---|---|
| 2005/0135067 A1* | 6/2005 | Park et al. .................. 361/715 |
| 2005/0139642 A1 | 6/2005 | Koning et al. |
| 2005/0167647 A1 | 8/2005 | Huang et al. |
| 2005/0201060 A1* | 9/2005 | Huang .................. 361/700 |
| 2005/0255304 A1 | 11/2005 | Brink |
| 2006/0255450 A1 | 11/2006 | Pan et al. |
| 2007/0126116 A1 | 6/2007 | Dangelo et al. |
| 2007/0155136 A1 | 7/2007 | Chrysler et al. |
| 2007/0235847 A1 | 10/2007 | Ramanathan et al. |
| 2008/0003801 A1 | 1/2008 | Dubin et al. |
| 2008/0081176 A1 | 4/2008 | Huang et al. |
| 2008/0087646 A1 | 4/2008 | Liu et al. |

FOREIGN PATENT DOCUMENTS

WO  PCT/US2007/005209    9/2008

OTHER PUBLICATIONS

Savas, Berber, et al., "Unusually High Thermal Conductivity of Carbon Nanotubes" May 15, 2000, pp. 4613-4616, vol. 84, No. 20, Physical Review Letters.

Javey, Ali, "Ten- to 50-nm-long quasi-ballistic carbon nanotube devices obtained without complex lithography" Sep. 14, 2004, pp. 13408-13410, vol. 101, No. 37, PNAS, www.pnas.org/cgi/doi/10.1073/pnas.0404450101.

* cited by examiner

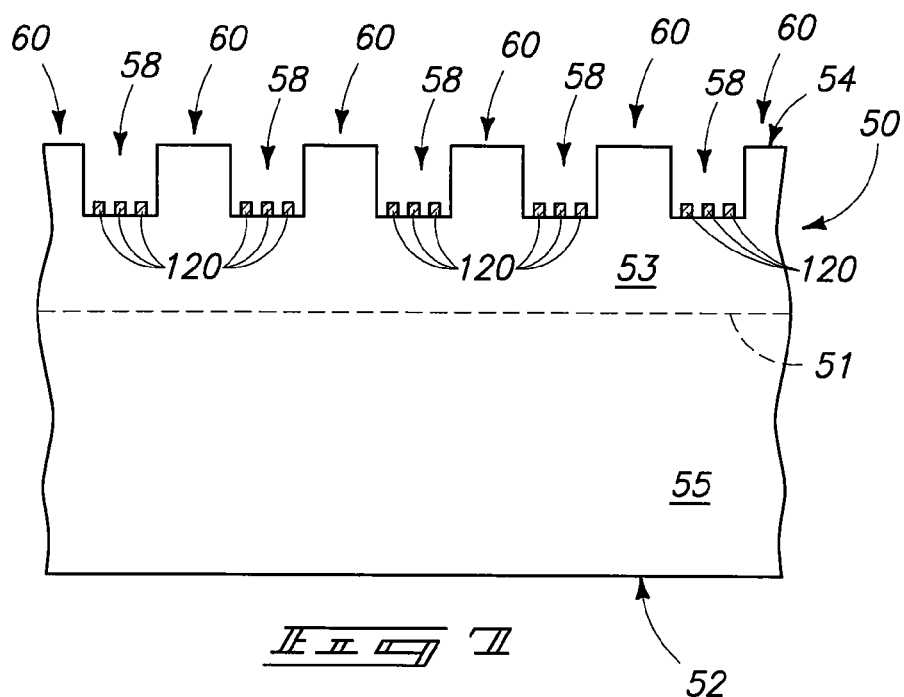
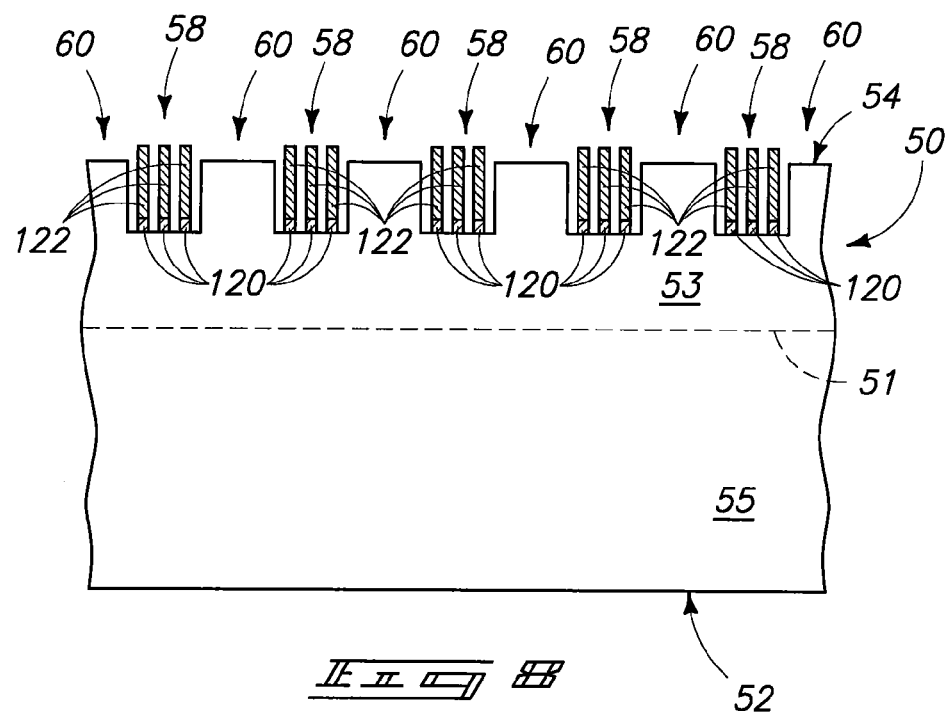

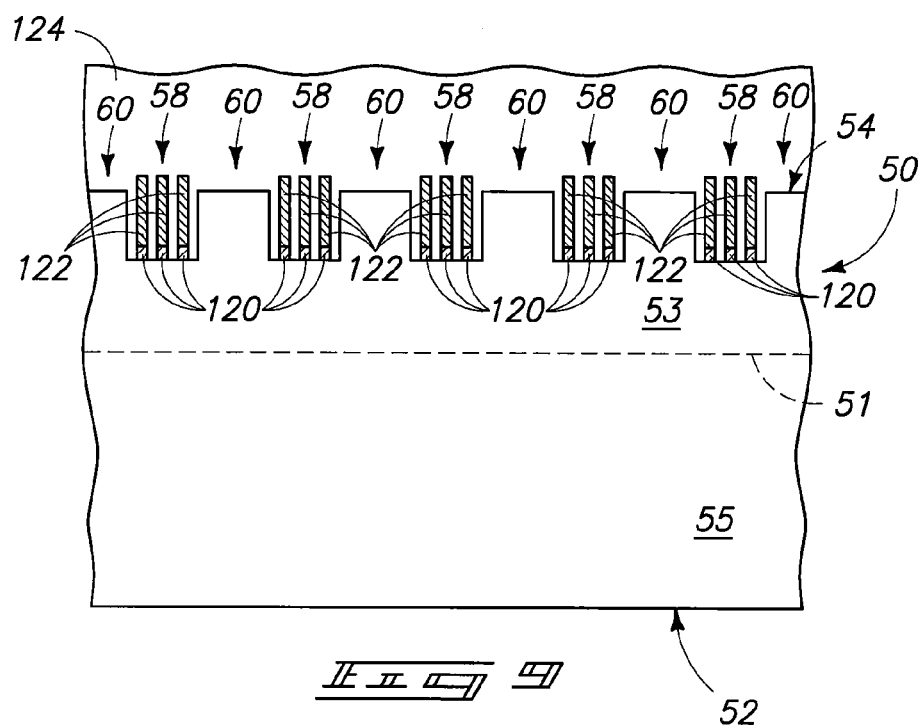
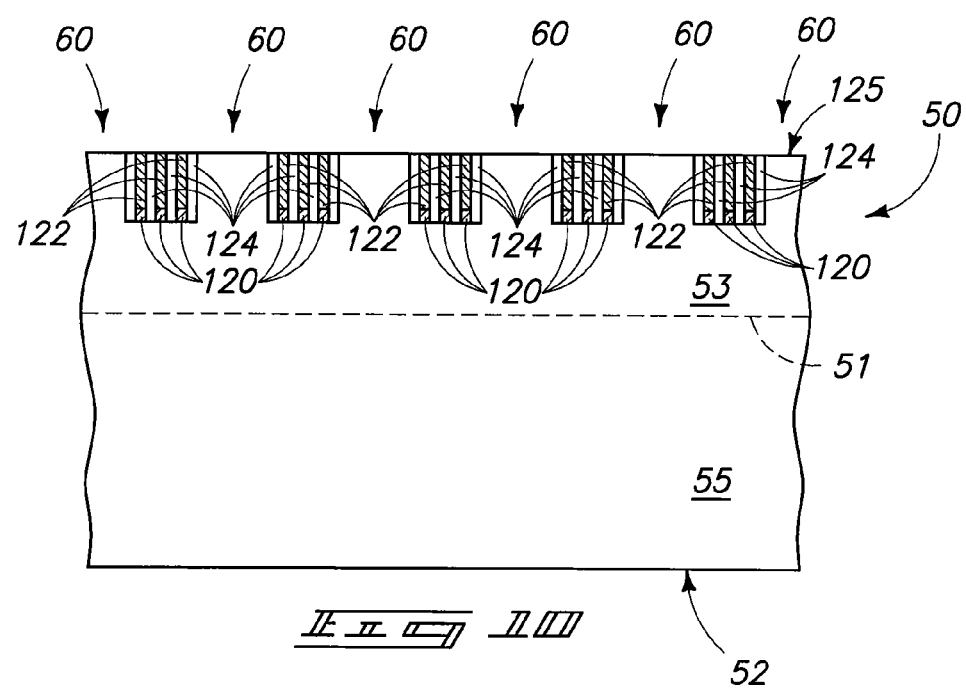

METHODS OF COOLING SEMICONDUCTOR DIES

RELATED PATENT DATA

This patent resulted from a divisional of U.S. patent application Ser. No. 12/356,384, which was filed Jan. 20, 2009, and which is hereby incorporated herein by reference; which resulted from a divisional of U.S. patent application Ser. No. 11/370,093, which was filed Mar. 6, 2006, which issued as U.S. Pat. No. 7,494,910 and which is hereby incorporated herein by reference.

TECHNICAL FIELD

The invention pertains to semiconductor packages, methods of forming semiconductor packages, and methods of cooling semiconductor dies.

BACKGROUND OF THE INVENTION

High-performance integrated circuits (for example, microprocessors, network processors, and high-speed static random access memory (SRAM)) run at high clock speeds and have high standby currents, which can result in very high heat generation during operation. Numerous difficulties are encountered in attempting to adequately remove thermal energy from such integrated circuits to avoid overheating of the circuits.

FIG. 1 shows a prior art semiconductor package construction 10 illustrating conventional methodologies for cooling an integrated circuit. The construction includes an integrated circuit chip or die 12. Such die will comprise a semiconductor material substrate and various integrated circuit components associated with the substrate. The substrate can, for example, comprise, consist essentially of, or consist of monocrystalline silicon. To aid in interpretation of the claims that follow, the terms "semiconductive substrate" and "semiconductor substrate" are defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

The die 12 has a frontside surface 14, and has a backside surface 15 in opposing relation to the frontside surface. Typically, the frontside surface of the die will be a surface of a passivation layer formed over various integrated circuit components that are in turn formed over a surface of a semiconductor substrate comprised by the die. In contrast, the backside surface of the die will frequently be a surface of the semiconductor wafer substrate comprised by the die.

The package 10 has various connectors 16 shown along the frontside surface of the die. Such connectors can be, for example, wire bonds or solder balls, and will connect circuitry associate with die 12 to other circuitry external of the die. The package 10 also comprises a board 18 adjacent connectors 16, and having additional conductive connectors 20 on an opposing side from the connectors 16. The board 18 can have various interconnects extending therethrough and connecting conductive connectors 20 on one side of the board with conductive connectors 16 on the other side of the board. The connectors 20 can correspond to pins, solder balls, or other conductive connections utilized for electrically connecting package 10 to circuitry associated with an electronic system.

The package 10 has cooling structures provided adjacent the backside 15 of die 12, and configured for removing thermal energy from the die. The shown structures include a heat spreader 22 and a heat sink 24. The heat spreader is configured to take heat from localized heated regions of die 12 and spread it more uniformly across a relatively large expanse, and the heat sink is utilized to transfer the heat to the environment external of package 10.

The heat spreader can comprise metal, and frequently will comprise a metal having excellent thermal conductivity, such as, for example, copper. Similarly, the heat sink will typically comprise a metal having excellent thermal conductivity and can, for example, comprise copper or aluminum. The heat sink will typically comprise a plurality of projections to enhance transfer of thermal energy from the heat sink to the surrounding environment. The exemplary heat sink 24 comprises a plurality of fins extending outwardly from die 12.

Although the heat sink and heat spreader can be separate from one another, and can have different functions, it is also possible for a single component to be provided that has the functions of both the heat sink and the heat spreader. For this and other reasons, the term "heat sink" is commonly utilized, in modern parlance to be generic in referring to structures traditionally referred to as either heat spreaders or heat sinks. Thus, the term "heat sink" is frequently utilized to refer to traditional heat sinks, as well as to traditional heat spreaders, as well as to structures having the combined functions of the traditional heat sinks and heat spreaders. For purposes of interpreting this disclosure and the claims that follow, the term "heat sink" is to be understood to be generic to both conventional heat spreaders and heat sinks unless it is expressly stated that the term is specific to a traditional heat sink.

The thermal transfer materials of package 10, as well as other thermal transfer materials known in the art for utilization in cooling semiconductor devices, suffer from a number of drawbacks. For instance, conventional heat sinks are made of black-coated metallic materials, and can be large and bulky; and conventional heat spreaders can also be unsuitably bulky. Additionally, conventional cooling methodologies lack suitable efficiency for cooling high-performance integrated circuitry, such as, for example, circuitry being developed for mobile devices like laptops, cell phones, personal digital assistants, etc.

It would be desirable to develop improved structures and methods for cooling integrated circuitry.

SUMMARY OF THE INVENTION

In one aspect, the invention includes a semiconductor package. The package comprises a semiconductor die, and a thermally conductive material in contact with the die. The thermally conductive material comprises carbon nanostructures, such as, for example, carbon nanotubes.

In one aspect, the invention includes a semiconductor package comprising a semiconductor material substrate having a frontside surface and a backside surface in opposing relation to the frontside surface. The backside surface includes a plurality of pedestals of the semiconductor material.

In one aspect, the invention includes a semiconductor package having at least two semiconductor dies. One of the semiconductor dies is a first semiconductor die comprising a backside surface, and another of the semiconductor dies is a second semiconductor die having a first surface in opposing relation to a second surface. A thermally conductive mat is between the backside surface of the first semiconductor die and the first surface of the second semiconductor die, and the mat comprises carbon nanostructures. A plurality of grooves extend within the second surface of the second semiconductor die, and a heat sink is across the plurality of grooves and thermally coupled with the second semiconductor die.

In one aspect, the invention includes a method of cooling a semiconductor package. A semiconductor package is provided which has a semiconductor die having a frontside surface and a backside surface in opposing relation to the frontside surface. The backside surface has a plurality of grooves extending therein. Coolant material is forced through the grooves.

In one aspect, the invention includes a method of forming a semiconductor package. A semiconductor die is provided, with such die comprising a substantially planar backside surface. A layer of carbon nanostructures is formed across the substantially planar backside surface of the die.

In one aspect, the invention includes a method of forming a semiconductor package in which a semiconductor die is provided which has a backside surface. Grooves are formed to extend into the backside surface, and a heat sink is provided across the grooves.

BRIEF DESCRIPTION OF THE DRAWINGS

Preferred embodiments of the invention are described below with reference to the following accompanying drawings.

FIG. 6 is a diagrammatic, three-dimensional view of the semiconductor package of FIG. 5 incorporated into an electronic system with a cooling system.

FIG. 7 is a diagrammatic, cross-sectional view of the semiconductor die of FIG. 4 shown at a processing stage subsequent to that of FIG. 4 in accordance with another aspect of the present invention.

FIG. 8 is a view of the FIG. 7 die shown at a processing stage subsequent to that of FIG. 7.

FIG. 10 is a view of the FIG. 7 die shown at a processing stage subsequent to that of FIG. 9.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

The invention includes semiconductor packages utilizing carbon nanotubes for thermal transfer, and includes methods for incorporating carbon nanotubes into semiconductor packages.

Carbon nanotubes can be insulating, semiconductive, or metallic in nature. The physical and electrical properties of carbon nanotubes can be influenced by the methodology utilized to grow the nanotubes. For instance, the bandstructure of carbon nanotubes can be dependent on the diameter of the tubes, the lattice structure within the tubes, the orientation of the tubes, and various other factors. However, it is generally recognized that carbon nanotubes having metal-like electrical properties can be relatively easily created. Specifically, it is recognized that large diameter nanotubes can have nearly zero bandgap, and can be highly conducting.

It is also recognized that carbon nanotubes can be single-walled or multi-walled. Even single-walled carbon nanotubes can conduct high current density. Some single-walled carbon nanotubes are known to conduct current densities greater than 50,000 amps per meter, which is among the highest density allowed by any conductor at room temperature. Further, carbon nanotubes can have very high thermal conductivity, and in some instances can have thermal conductivity that is at least about a factor of five greater than copper at room temperature. Also, carbon nanotubes can be extremely strong, and in some instances can have an axial tensile strength that is at least about 50 times greater than that of the highest grade steel.

As is known to persons of ordinary skill in the art, thermal energy can be considered to comprise quantized units referred to as phonons. The phonon mean free path can be very long in carbon nanotubes (due to very low scattering), which can be one of the reasons for the high thermal conductivity observed in carbon nanotubes.

In some aspects, the invention includes incorporation of carbon nanotubes within semiconductor die packages, and utilization of the high thermal conductance of the carbon nanotubes for cooling of semiconductor dies within the packages. For purposes of interpreting this disclosure and the claims that follow, a nanostructure is to be understood as a structure having at least one cross-sectional dimension on the order of $10^{-7}$ (in other words, on the order of 100 nm or less). Carbon nanostructures can have numerous forms, including, for example, various ball forms (so-called buckyballs), or tubular forms (so-called nanotubes, which can be single or multi-walled nanotubes).

Exemplary aspects of the invention are described with reference to FIGS. 2-18.

Figure 2:
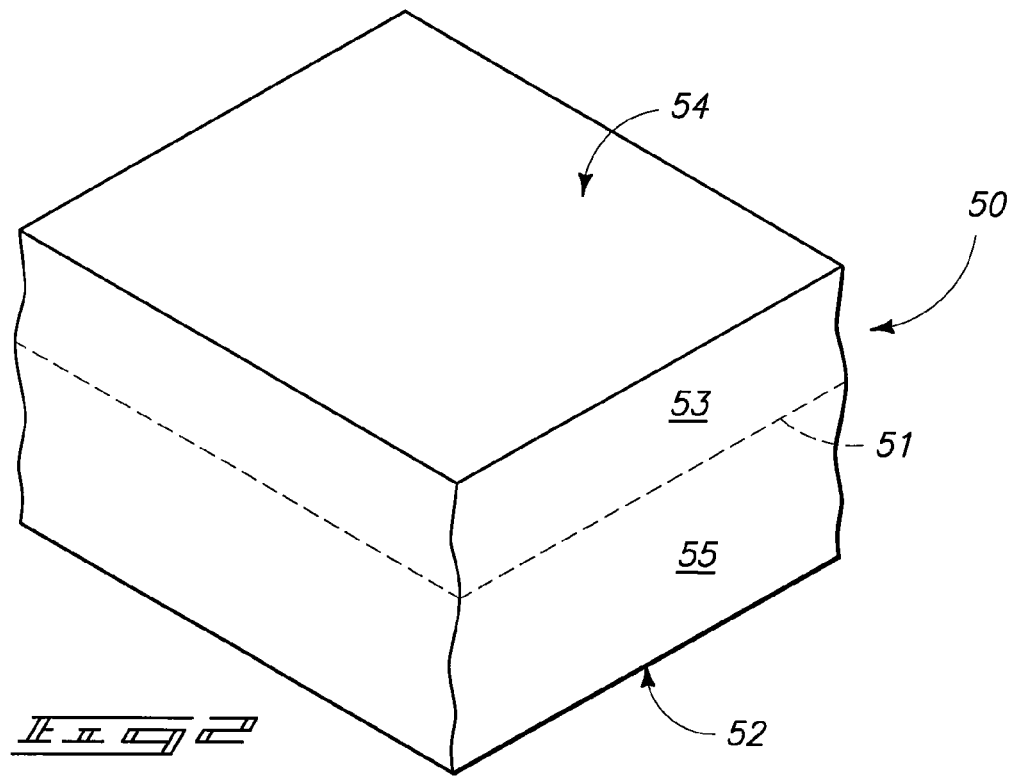
FIG. 2 is a diagrammatic, three-dimensional view of a semiconductor die at a preliminary processing stage in accordance with an exemplary aspect of the present invention.

Referring initially to FIG. 2, a semiconductor die 50 is illustrated in three-dimensional view. The die has a frontside surface 52 and a backside surface 54 in opposing relation to the frontside surface. As discussed above in the "background" section of this disclosure, the semiconductor die will typically comprise a semiconductor material substrate having various integrated circuit elements associated therewith. The various integrated circuit elements will typically be proximate the frontside surface 52 of the die, whereas the backside surface 54 will typically comprise semiconductor material of the semiconductor material substrate.

In the shown aspect invention, the die 50 comprises a first portion 53 and a second portion 55. The first portion can be considered to correspond to a semiconductor material substrate (such as, for example, a monocrystalline silicon substrate), and the second portion 55 can be considered to correspond to integrated circuitry associated with the semiconductor material substrate. A dashed line 51 is provided to diagrammatically illustrate a boundary between the semiconductor material substrate and the integrated circuitry. It is to be understood, however, that the dashed line is provided only for illustrative purposes to assist in explaining invention, and that in practice the integrated circuitry will typically extend into the semiconductor material substrate as well as being formed outwardly of a surface of the substrate.

The backside surface 54 of die 50 can, in some aspects, comprise, consist essentially of, or consist of semiconductor material of the substrate 53; and in particular aspects can comprise, consist essentially of, or consist of monocrystalline silicon.

Figure 3:
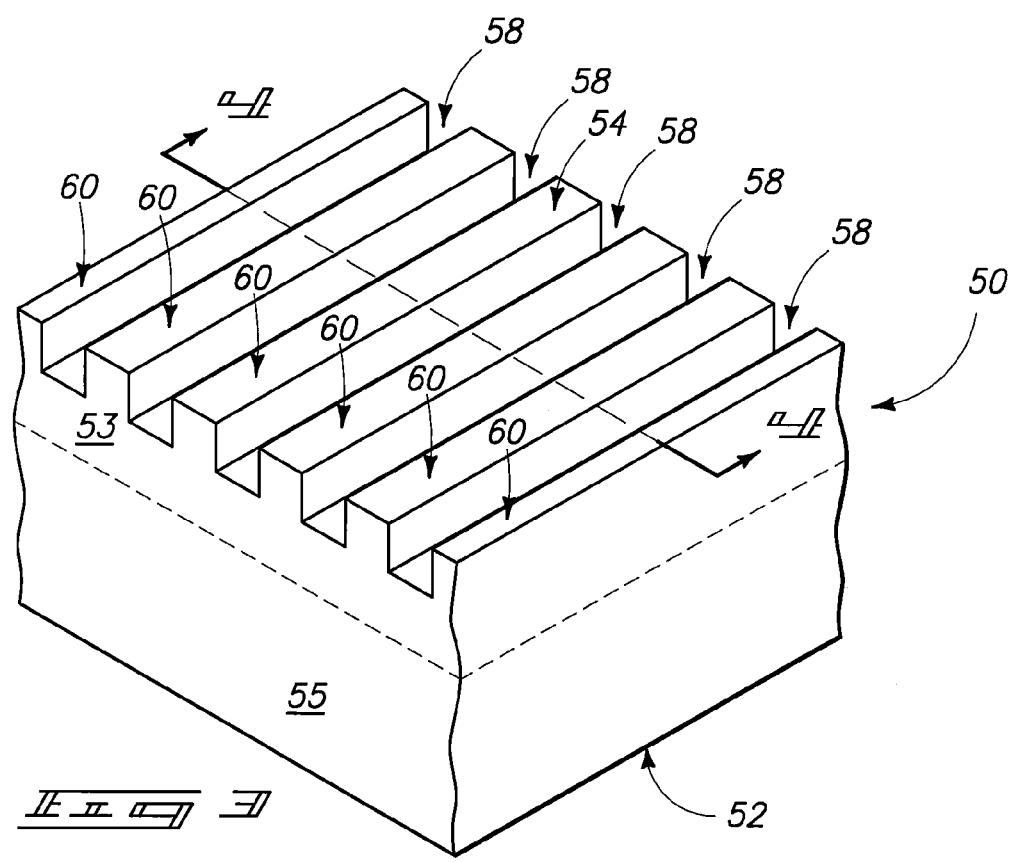
FIG. 3 is a view of the FIG. 2 semiconductor die shown at a processing stage subsequent to that of FIG. 2.

Referring next to FIG. 3, a plurality of grooves 58 are formed to extend into the backside 54 of semiconductor die 50, and in the shown aspect are formed to extend into a backside of semiconductor material substrate 53. The grooves are separated from one another by pedestals 60 of semiconductor material of substrate 53. The grooves can be formed by any suitable processing, including, for example, utilization of a photolithographically-patterned photoresist mask (not shown) to define locations of the grooves, followed by a suitable etch to form the grooves, and subsequent removal of the mask.

Although the shown aspect has a plurality of parallel grooves formed within the backside of die 50, it is be understood that any suitable pattern can be formed, including, for example, patterns having crisscrossed grooves and patterns having non-groove-shaped openings. Also, although the shown backside of die 50 corresponds to a backside of a semiconductor material substrate 53, it is to be understood that there can also be applications in which structures (such as, for example, circuit structures and/or electrically insulative layers) are part of the die and are along the backside of the die over the semiconductor material substrate. In such applications the grooves, or other openings, formed into the backside of the die may or may not extend into the backside of the semiconductor material substrate comprised by the die.

Figure 4:
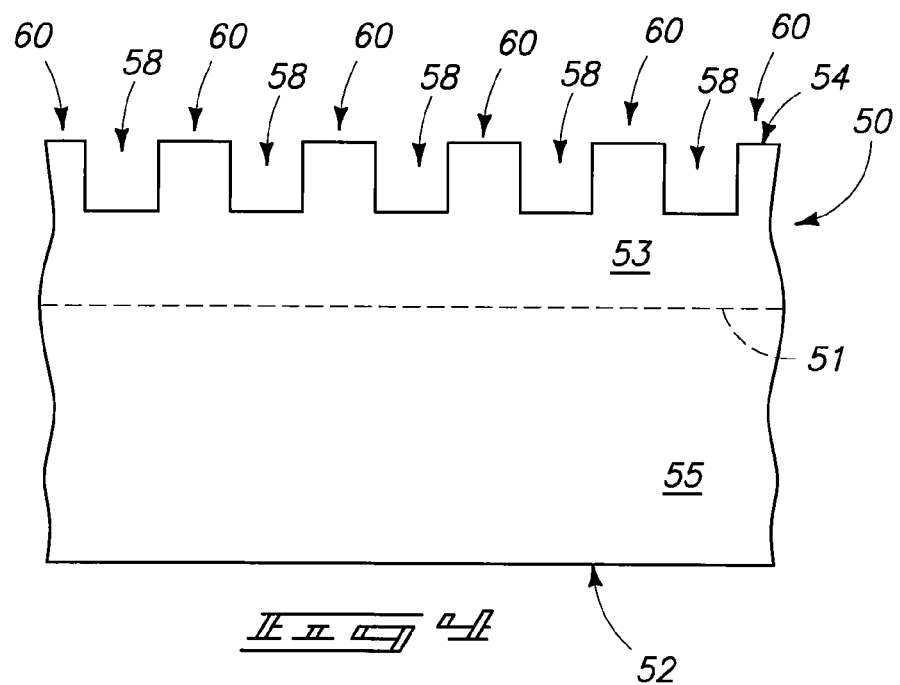
FIG. 4 is a diagrammatic, cross-sectional view of the FIG. 2 semiconductor die along the line 4-4 of FIG. 3.

Referring to FIG. 4, such shows a two-dimensional cross-section through the die 50 of FIG. 3. Such two-dimensional view will be utilized for discussion of incorporation of the die into a package.

Figure 1:
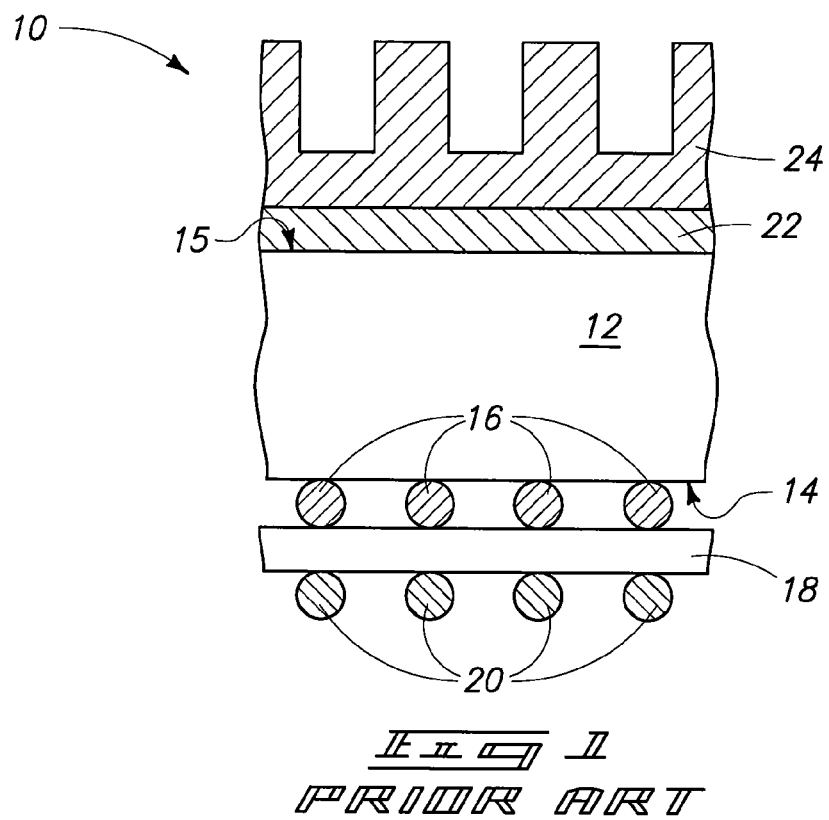
FIG. 1 is a diagrammatic, cross-sectional view of a prior art semiconductor package.
Figure 5:
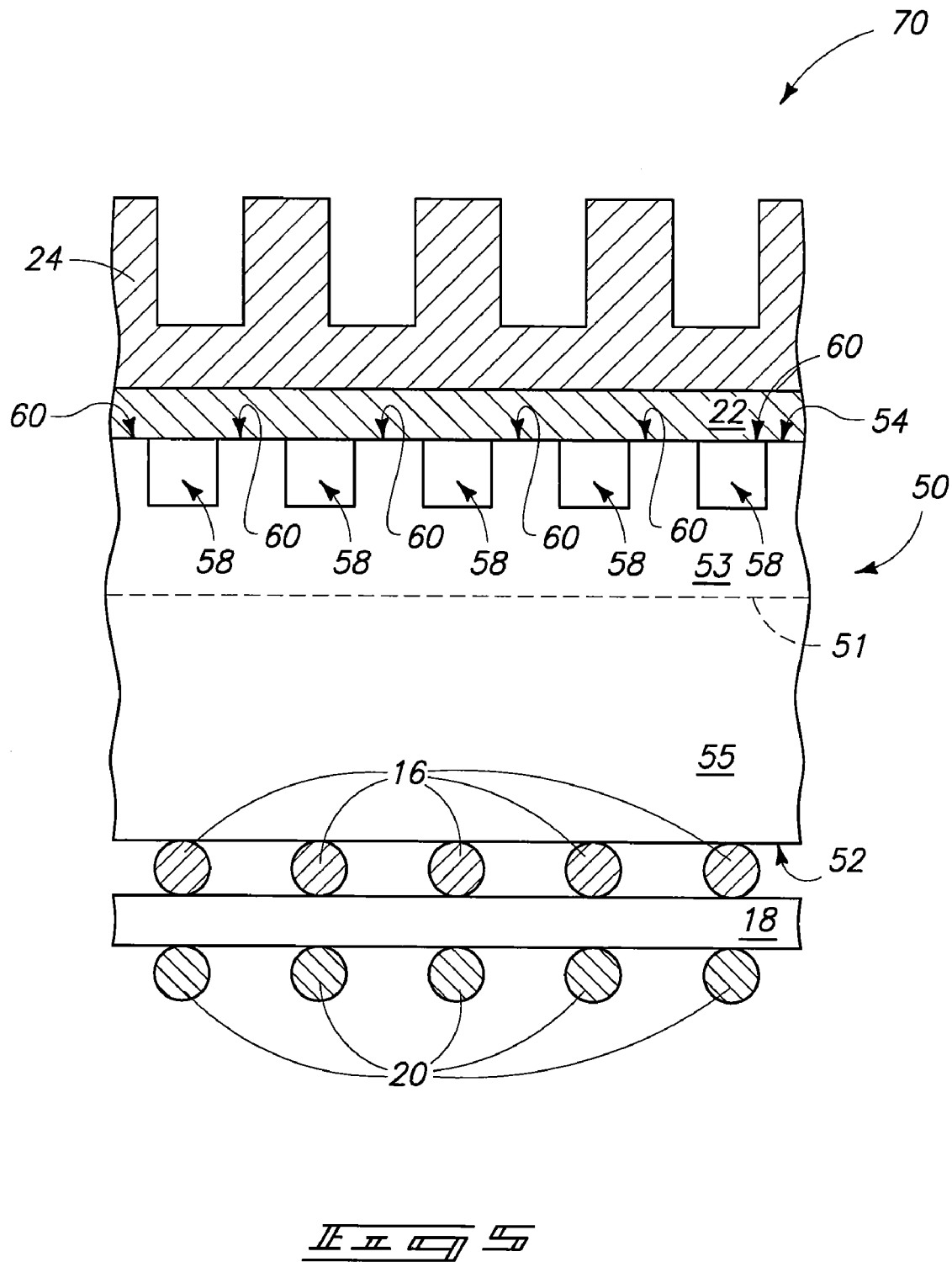
FIG. 5 is a view of the semiconductor die of FIG. 4 shown at a processing stage subsequent to that of FIG. 4, and specifically shown incorporated into a semiconductor package.

Referring to FIG. 5, die 50 is shown incorporated into a package 70. The package includes the interconnects 16, board 18 and interconnects 20 discussed above with reference to the prior art package of FIG. 1; and further includes the heat spreader 22 and heat sink 24 that were also discussed above with reference to the prior art package of FIG. 1. The heat spreader 22 is shown to be in the form of a plate provided across grooves 58.

In the shown application, the pedestals 60 of semiconductor material substrate 53 have substantially planarized upper surfaces, and the heat spreader 22 is over and directly against such planarized upper surfaces. Such leaves the grooves 58 open beneath the heat spreader. In some aspects of the invention, the grooves are utilized as channels for flow of coolant beneath the heat spreader.

Although both a heat spreader and heat sink are shown in the exemplary aspect invention of FIG. 5, it is to be understood that a single thermally-conductive structure can be formed over the grooves, and such single structure can be referred to as a heat sink. Also, it is be understood that in accordance with modern parlance, the heat spreader can alternatively be referred to as a heat sink.

Referring to FIG. 6, package 70 is shown incorporated into a system 100. The system 100 can be an electronic system, such as, for example, a laptop computer, a mobile phone, a personal digital assistant, an automobile, an airplane, etc. The package 70 is diagrammatically shown connected to a support structure 102. Such support structure can have various electronic components associated therewith, and such components can be interconnected with the integrated circuit components of die 50 through the interconnects 20 of package 70.

A coolant-projector 104 is diagrammatically illustrated in FIG. 6 to be provided proximate package 70. The coolant-projector forces coolant 106 toward package 70. The coolant is projected along directions indicated by arrows 108. The coolant-projector can be any suitable apparatus, and can, for example, comprise a pump, fan, blower, etc. The coolant can be any suitable material, and can, for example, be in the form of a fluid (liquid and/or gas). If the coolant is gas, it can be forced into and through grooves 58 by being blown into the grooves with a fan utilized as coolant-projector 104, and/or by utilizing convection to draw the coolant through the grooves. If the coolant is a liquid, it can be forced into and through the grooves with a pump utilized as coolant-projector 104, and/or by utilizing capillary action and/or convection to draw the coolant through the grooves.

Heat spreader 22 is in the thermal contact with die 50 through the coolant flowing through grooves 58. The heat spreader can also be in thermal contact with the die by being directly against the backside surface of the die. However, the backside surface will frequently have relatively poor thermal conductivity.

In some aspects, acoustics can be utilized to draw thermal energy from die 50. Specifically, a resonator can be provided additionally, or alternatively, to the coolant-projector 104. The resonator can be tuned to vibrate at an appropriate energy such that it draws of phonons from die 50 to cool the die. In such aspects, the coolant flowed into grooves 58 can be of an appropriate nature to assist in transfer of phonons from the die 50 to the resonator.

The grooves 58 can be utilized as open channels as discussed above. Alternatively, thermally conductive material can be provided within the grooves to line the grooves, or in some aspects to fill the grooves. For instance, the grooves can be lined with metallic material at the processing stage of FIG. 4. The lined grooves can still function as open channels within the package 70 of FIG. 6, but may have improved thermal transfer properties for removing thermal energy from die 50 due to the metallic liner.

In some aspects, carbon nanostructures can be provided within the grooves to enhance thermal transfer from die 50 to materials provided over the backside surface of the die. Such aspects are described with reference to FIGS. 7-11.

FIG. 7 shows the die 50 of FIG. 4 at a processing stage subsequent to that of FIG. 4. Metallic seeds 120 have been formed at the bottoms of grooves 58. The metallic seeds are configured to be suitable for growth of carbon nanostructures, and can, for example, correspond to zinc nanocrystals. The seeds can be considered to be in the form of a seed layer, and the individual seeds within such layer can be randomly distributed. The seeds can be formed with any suitable processing, and in some aspects will be deposited utilizing, for example, atomic layer deposition, chemical vapor deposition and/or physical vapor deposition.

Referring to FIG. 8, carbon nanostructures 122 are grown over the seeds 120. The carbon nanostructures can be, for example, carbon nanotubes, and such can be either single-walled nanotubes or multi-walled nanotubes. The carbon nanostructures can be formed with any suitable processing, including, for example, chemical vapor deposition. The deposition conditions can be tailored to predominantly grow large diameter (greater than equal to 50 nm diameter) carbon nanotubes. The carbon nanotubes will preferably have appropriate chirality to have metallic thermal conductivity characteristics, however, some of the nanotubes can have different chirality than others so that some of the nanotubes are more metallic in character than others.

In the shown aspect the invention, the carbon nanostructures 122 are nanotubes in the form of vertical columns extending upwardly within the grooves. The carbon nanostructures can be provided to suitable density to substantially fill the grooves, or can be provided to a density which fills less than half of the volume within the grooves. The shown carbon nanotubes extend upwardly to an elevation above the planarized backside surface of die 50. Such can be advantageous for creating good thermal contact between the carbon nanotubes and heat sink structures subsequently formed across the backside surface, as will become more clear from the discussion that follows. The carbon nanotubes can be formed to any suitable height, and in some aspects will be formed to a height of from about 0.5 microns to about 2.0 microns.

Figure 9:
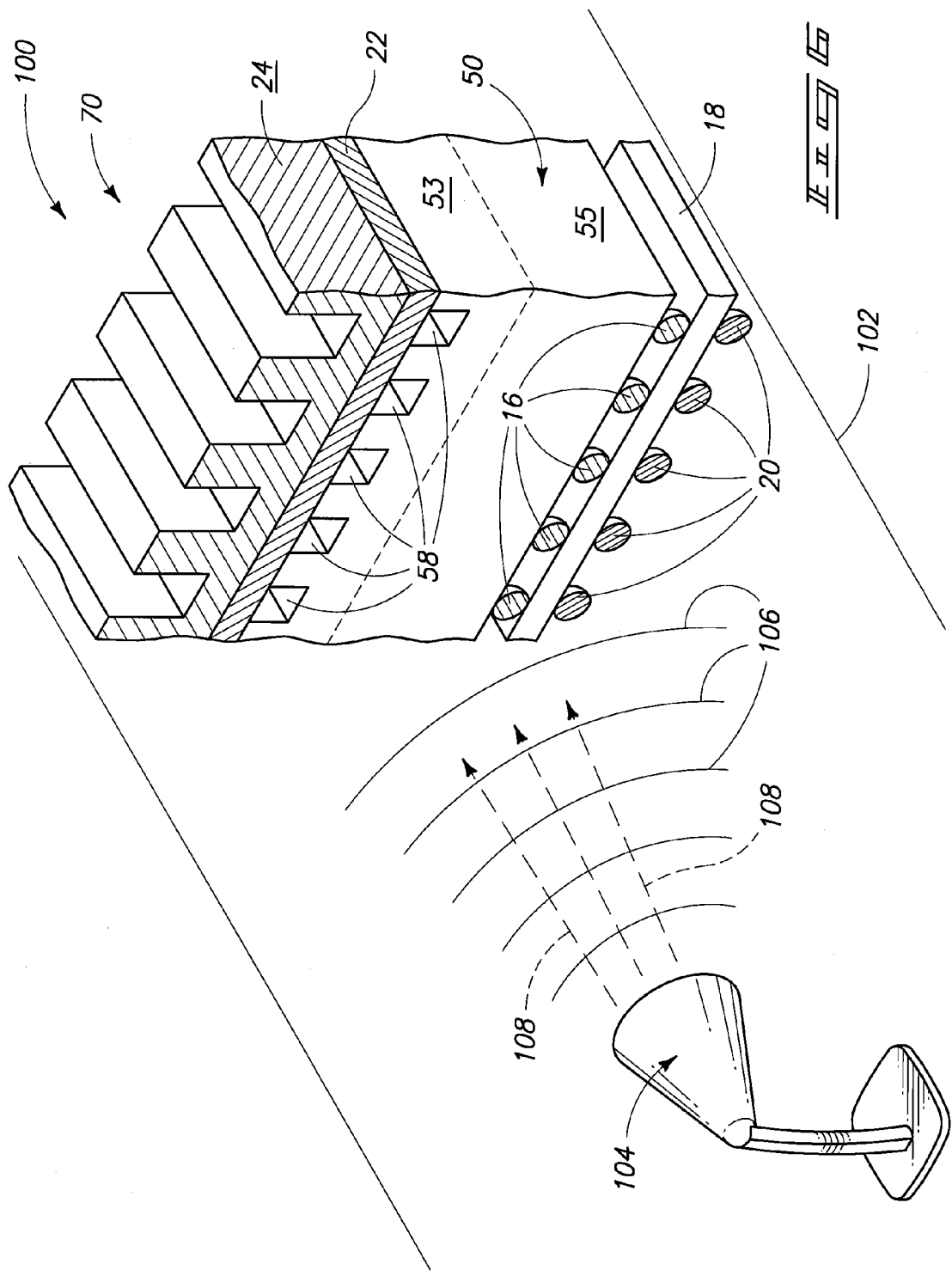
FIG. 9 is a view of the FIG. 7 die shown at a processing stage subsequent to that of FIG. 8.

Referring to FIG. 9, dielectric material 124 is formed over backside surface 54 and within grooves 58. The dielectric material can comprise any suitable composition or combination of compositions, and in some aspects can comprise, consist essentially of, or consist of silicon dioxide. The dielectric material extends around and between the carbon nanotubes 122, and provides structural support to the carbon nanotubes during subsequent processing.

Referring to FIG. 10, planarization is conducted to form a planarized surface 125 extending across pedestals 60, carbon nanostructures 122 and dielectric material 124. The planarization can comprise, for example, chemical-mechanical polishing. Planarized surface 125 is now the backside surface of die 50.

Figure 11:
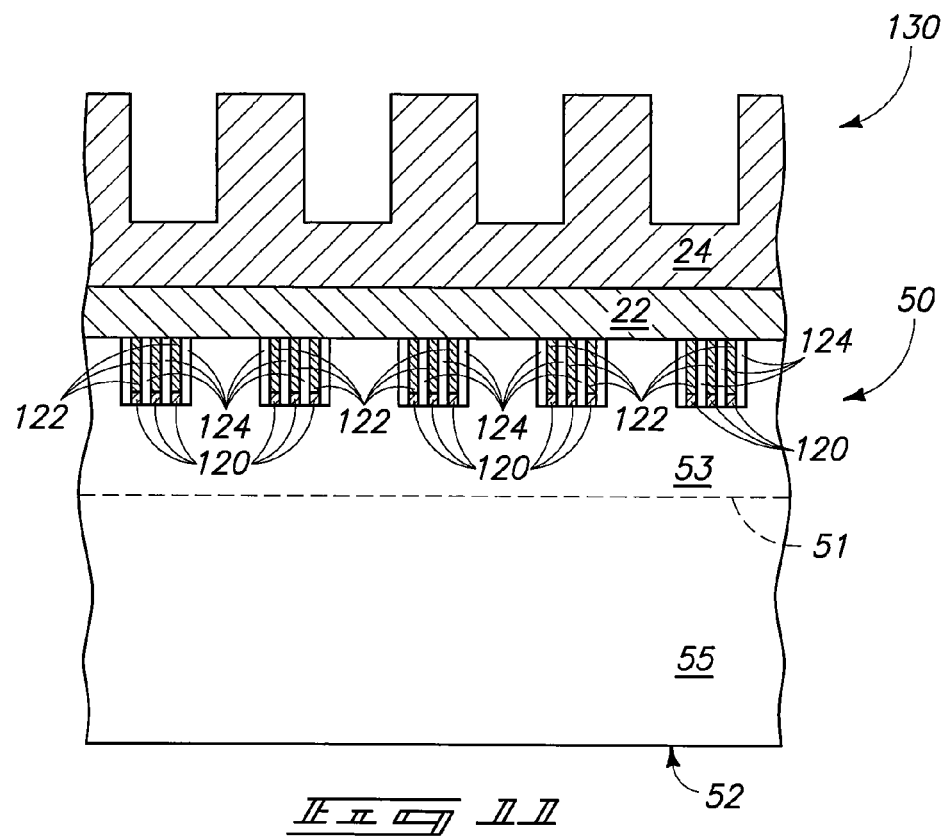
FIG. 11 is a view of the FIG. 7 die shown at a processing stage subsequent to that of FIG. 10, and specifically shown incorporated into a package with a heat spreader and a heat sink.

Referring to FIG. 11, the heat spreader 22 is placed against planarized backside surface 125, and the heat sink 24 is provided over heat spreader 22 to form a semiconductor package 130. The carbon nanotubes 122 extend upwardly through dielectric material 124 to thermally connect with heat spreader 22. Additionally, the carbon nanotubes are thermally connected with semiconductor material of die 50 through metallic seed material 120 at the bottom surfaces of the grooves.

In some aspects, it can be advantageous to enhance the conductivity of the carbon nanotubes by forming a thermally conductive coating along the carbon nanotubes. For instance, a metallic coating can be formed along the carbon nanotubes by, for example, one or more of atomic layer deposition, chemical vapor deposition and physical vapor deposition. Such aspect of the invention is described in more detail below with reference to FIG. 18.

Figure 12:
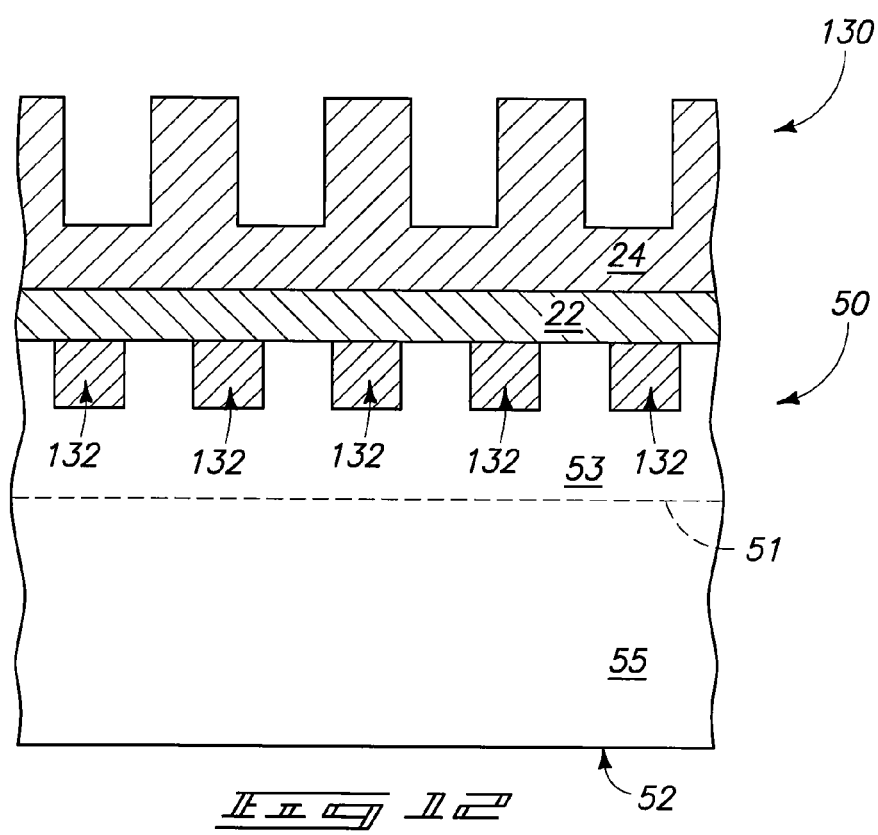
FIG. 12 is a view of a package analogous to that of FIG. 11, illustrating further aspects of the present invention.

The construction of FIG. 11 can be considered to have thermal transfer material within grooves 58 (with such grooves the illustrated in, for example, FIG. 7). In some aspects, other thermally conductive materials besides carbon nanostructures can be utilized in addition to, or alternatively to, the carbon nanostructures as the thermal transfer material within the grooves. For instance, the grooves can be filled with metal, diamond, or diamond-like carbon in some aspects the invention. FIG. 12 generically shows the package 130 of FIG. 11 with conductive material 132 filling the grooves. Such conductive material can predominantly comprise carbon nanostructures in some aspects. In other aspects, the thermally conductive material 132 can comprise, consist essentially of, consist of one or more other thermally conductive compositions.

The aspects of the invention described thus far utilize grooves or openings formed in the backside of a die for transfer of thermal energy from the die (in other words, cooling of the die). It is to be understood, however, that the invention also includes aspects in which the thermal advantages of carbon nanostructures are utilized across a planar die surface. Such aspects are described with reference to FIGS. 13-15.

Figure 13:
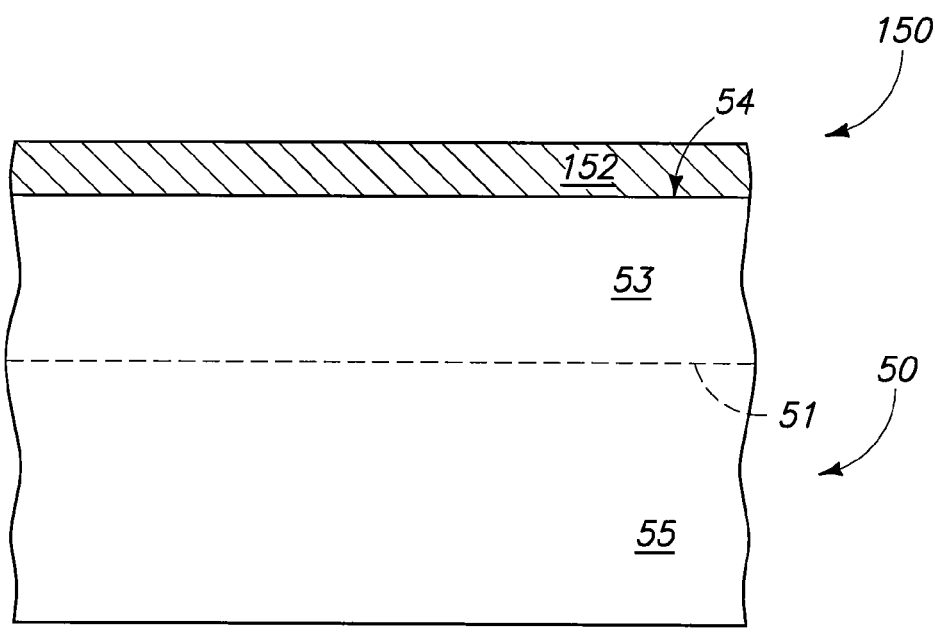
FIG. 13 is a diagrammatic, cross-sectional view of a semiconductor die assembly illustrating another aspect of the present invention.

Referring to FIG. 13, an assembly 150 is illustrated comprising the die 50 described previously, and a thermally conductive layer, or material, 152 formed across a planar backside surface of the die. The thermally conductive layer can comprise carbon nanostructures, and in particular aspects can comprise, consist essentially of, or consist of carbon nanotubes. The carbon nanotubes can be randomly distributed so that the layer 152 can be considered to be a carpet or mat comprising fibers corresponding to carbon nanotubes.

In some aspects, the carbon nanostructures will be the only thermally conductive composition within layer 152. In such aspects the carbon nanostructures can be the only component present within layer 152, or can be retained within a relatively non-thermally-conductive composition, such as, for example, silicon dioxide.

In other aspects, the carbon nanostructures can be present with one or more other thermally conductive compositions, and in such aspects the carbon nanostructures can, for example, be coated with metal. If the carbon nanostructures are coated with metal, such coated structures can be the only component of layer 152, or can be retained within a non-thermally-conductive material, such as, for example, silicon oxide.

In aspects in which carbon nanostructure fibers are retained within a non-thermally-conductive material, the carbon nanostructure fibers can be considered to form a thermally conductive matrix extending throughout the non-thermally-conductive material. The combined carbon nanostructure fibers and non-thermally-conductive material together form a mixed-composition layer 152. The density of the carbon nanostructures (in other words, the amount of carbon nanostructures per unit volume) within such mixed-composition layer is sufficient for achieving desired a thermal conductivity through the layer. Generally, the layer will at least predominately comprise carbon nanostructures.

The layer 152 can be formed by any suitable processing, including, for example, formation of nanocrystalline metallic seed material across the backside surface 54 of die 50 followed by growth of the carbon nanotubes on the metallic seed material. Further, if it is desired to have non-thermally-conductive material within layer 152, such can be deposited over and between the carbon nanotubes. For instance, silicon dioxide can be chemical vapor deposited over and between the carbon nanotubes. Subsequent to the deposition of such silicon dioxide, an upper surface of layer 152 can be subjected to planarization (such as, for example, chemical-mechanical polishing) so that carbon nanotubes are exposed along such upper surface. The planarization-accomplished exposure of the carbon nanotubes can be similar to the processing discussed above with reference to FIGS. 9 and 10.

Figure 14:
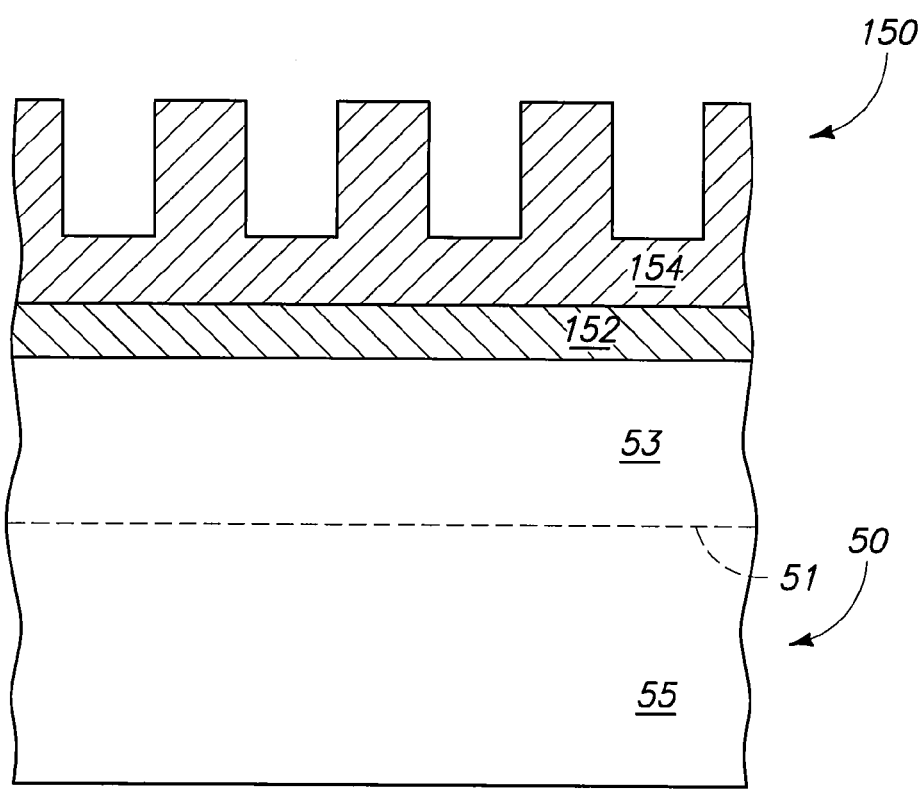
FIG. 14 is a view of the FIG. 13 assembly shown at a processing stage subsequent to that of FIG. 13 in accordance with an aspect of the present invention.

Referring to FIG. 14, a heat sink 154 is provided over layer 152 to incorporate assembly 150 into a semiconductor package. The heat sink can be formed of metallic material, such as, for example, copper or aluminum, and has a plurality of fins extending along an outer surface of the package. The heat sink 154 is shown provided directly against layer 152, and accordingly would be directly against carbon nanostructures within layer 152. Layer 152 is also shown formed directly against a backside surface of die 50, and specifically is shown physically against a backside surface of semiconductor material substrate 53. Accordingly, carbon nanostructures within layer 152 thermally couple the semiconductor material substrate with the heat sink. The carbon nanostructures can also advantageously provide high tensile support to the backside of the die, and between the die and the heat sink, due to the high tensile strength of the carbon nanostructures.

As discussed previously, the heat sink can, in some aspects, comprise a heat spreader. In the shown aspect, the layer 152 comprising the carbon nanostructures is the only thermally conductive material between the die and the heat sink, but it is to be understood that other thermally conductive materials could be included between the die and the heat sink in other aspects of the invention (not shown).

In some aspects of the invention, thermally conductive material is utilized to thermally couple multiple dies in a thermal series with one another in a multi-chip package. Such aspects are described with reference to FIGS. 15 and 16.

Figure 15:
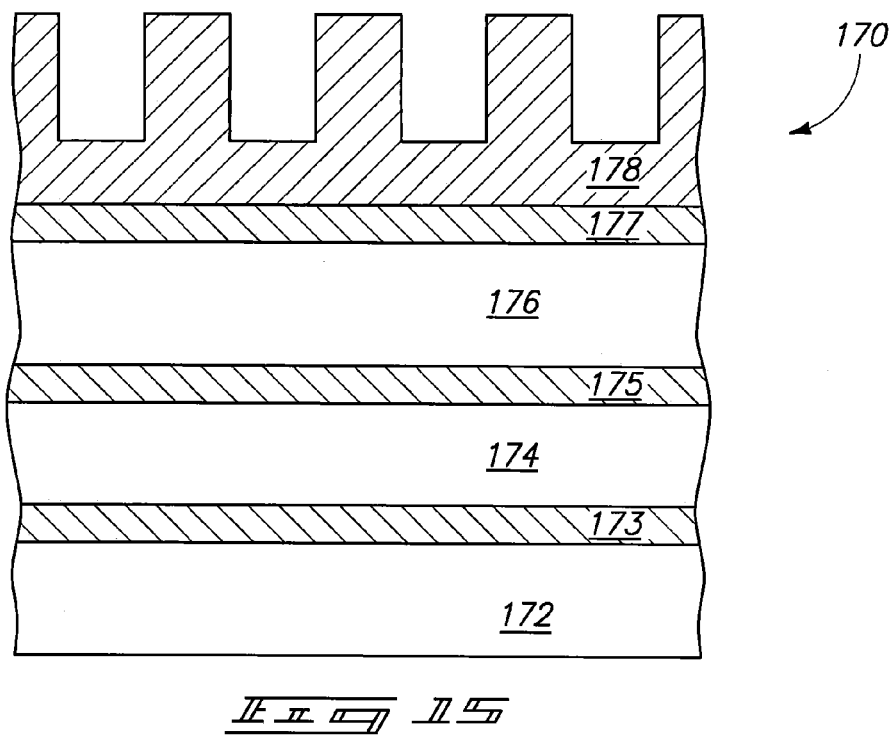
FIG. 15 is a diagrammatic, cross-sectional view of a semiconductor package illustrating another aspect of the present invention.

Referring to FIG. 15, a multi-chip package 170 is shown to comprise a series of chips 172, 174 and 176 which are thermally interconnected through thermally conductive layers 173 and 175. The chips are semiconductor dies of the type described previously, and accordingly have frontside surfaces and backside surfaces, as well as having semiconductor material substrates therein. The thermally conductive layers 173 and 175 can comprise any suitable thermally conductive materials, and in some aspects one or both of the layers 173 and 175 can be identical to the layer 152 discussed above with reference to FIGS. 13 and 14. Accordingly, one or both of the thermally conductive layers 173 and 175 can comprise carbon nanotubes, and/or other carbon nanostructures. In some aspects, one of the chips (such as, for example, chip 172) can be referred to as a first semiconductor die, and another of the chips (such as, for example, chip 174) can be referred to as a second semiconductor die. The first and second semiconductor dies can then be considered to be thermally coupled to one another with the thermally conductive material 173 between the dies. In some aspects, such thermally conductive material can comprise carbon nanostructures that are in thermal contact with each of the first and second semiconductor dies.

The dies utilized in the multi-chip package can be formed to be thinner than dies utilized in single-chip packages, and typically would utilize semiconductor material substrates that are thinned to less than 20 µm. For instance, if the semiconductor material substrates utilized in the dies are monocrystalline silicon, such substrates can be formed from a monocrystalline silicon wafer that has been thinned to less than or equal to 20 µm utilizing, for example, chemical-mechanical polishing and/or etching technologies.

The package 170 is further shown comprising a heat sink 178 which is thermally coupled with chip 176 through a thermally conductive layer 177. The layer 177 can be identical to the layer 152 discussed above with reference to FIGS. 13 and 14; and the heat sink can be identical to the heat sink 154 discussed above with reference to FIG. 14.

Figure 16:
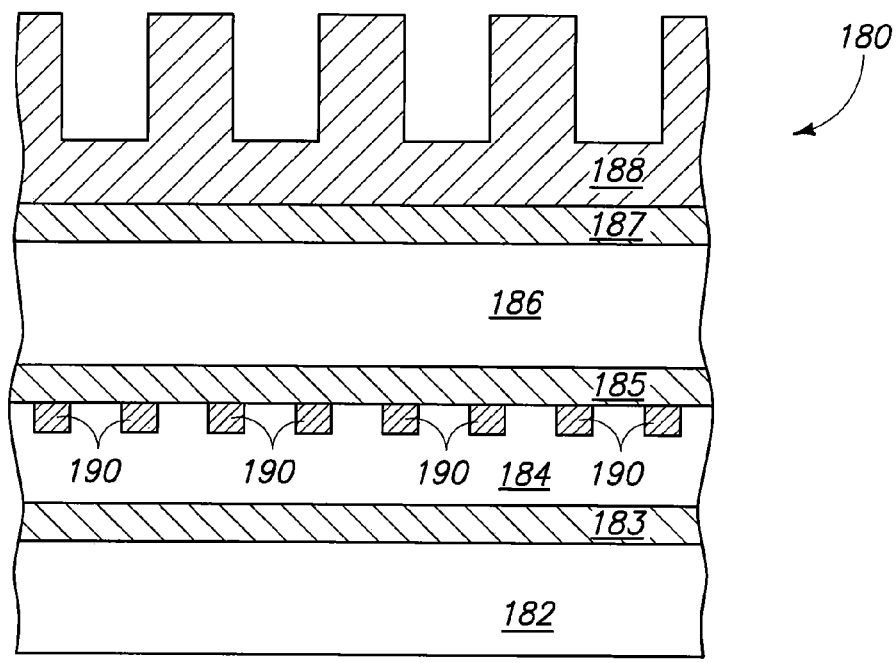
FIG. 16 is a diagrammatic, cross-sectional view of a semiconductor package illustrating yet another aspect of the present invention.

Referring next to FIG. 16, such illustrates another exemplary multi-chip package 180. The package includes semiconductor chips 182, 184 and 186; and includes thermally conductive layers 183, 185 and 187. The package further includes a heat sink 188 thermally coupled to chip 186 through thermally conductive layer 187.

The thermally conductive layers can comprise any suitable thermally conductive composition or combination of compositions. In some aspects, at least one of the thermally conductive layers will comprise carbon nanostructures, and accordingly will have a construction of the type discussed above with reference to layer 152 of FIGS. 13 and 14. In some aspects, at least one of the thermally conductive layers, such as, for example, the layer 185, can correspond to a metallic plate; or can correspond to a metallic plate in combination with a layer comprising carbon nanostructures.

The chip 184 is shown as a construction analogous to that discussed above with reference to FIGS. 10-12, and specifically is shown having grooves (or trenches) 190 extending therein and filled with thermally conductive material. The thermally conductive material within the trenches 190 can be any suitable thermally conductive material, and in some aspects can comprise one or both of carbon nanostructures and metal.

The package 180 of FIG. 16 shows that the aspects of the invention discussed above regarding formation of thermally conductive material within trenches in a semiconductor die backside can be combined with other aspects discussed above regarding formation of thermally conductive layers (or mats) comprising carbon nanotubes. Although only one of the chips is shown having grooves formed therein, it is to be understood that the multi-chip package could comprise multiple chips having grooves formed therein and filled with thermally-conductive material.

Figure 17:
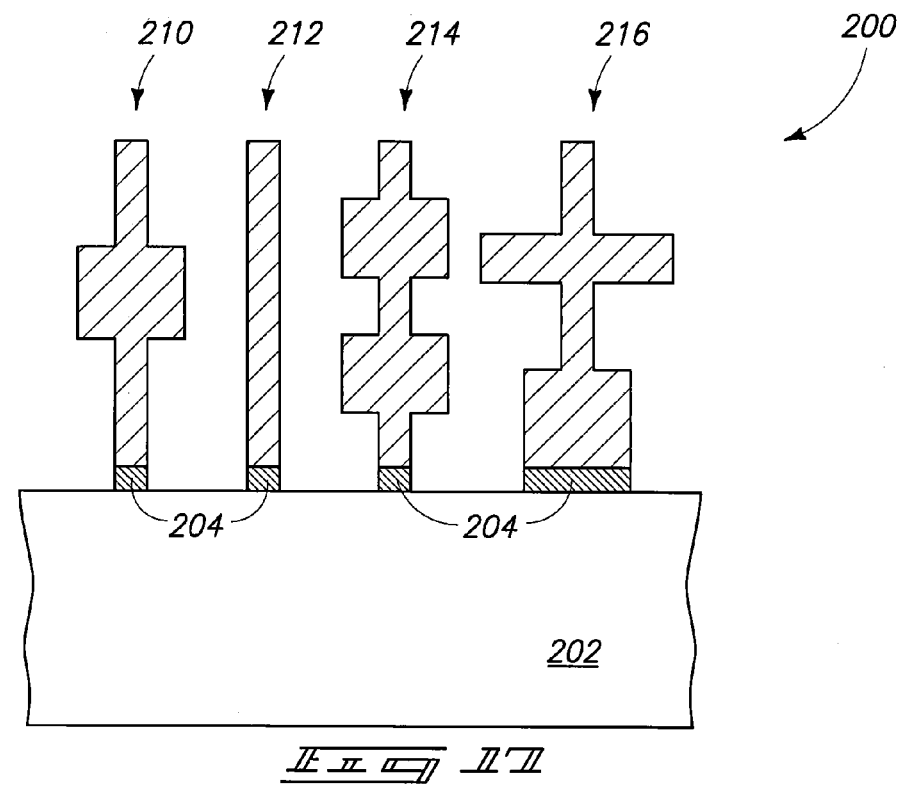
FIG. 17 is a diagrammatic, cross-sectional view of a semiconductor assembly illustrating yet another aspect of the present invention.

The carbon nanotubes utilized in various aspects the invention can have any suitable configuration. FIG. 17 illustrates an assembly 200 comprising a plurality of carbon nanotubes 210, 212, 214 and 216 formed over a substrate 202; with the nanotubes 210, 212, 214 and 216 illustrating various exemplary configurations. The nanotubes are shown grown over nanocrystals 204, which can correspond to, for example, metallic nanocrystals.

The nanotube 212 illustrates a simple vertically-extending tube having a relatively constant thickness from the bottom of the tube to the top of the tube. Appropriate conditions can be chosen to form the tube to have a desired height, thickness and chirality.

The nanotubes 210, 214 and 216 illustrate various embodiments of tubes having thin regions joining to thicker regions. The tubes can be chosen to have bandgaps that are largely dependent on the diameter of the tubes. In some aspects, nanotubes of the types corresponding to tubes 210 and 214 can be created by utilizing a process flow chosen to start growing carbon nanotubes on seed layers with small dimensions corresponding to small diameter nanotubes, and then switching the growth process to conditions (for example, changing one or more of temperature, pressure and gas flow rates) which change the diameter to a larger diameter. The processing can then be switched back to conditions which form smaller diameter extensions of the nanotubes, and such a processing can be switched back-and-forth to form nanotubes having desired combinations of thick regions and thin regions. In other aspects, the processing conditions can be chosen to form nanotube structures of the type shown as 216 by forming the thick region first, followed by formation of a thin region, and then switching the conditions back and forth to form the number of thick regions and thin regions desired in a particular nanotube structure.

Since the band gap of a carbon nanotubes can be dependent on the diameter the tube, the utilization of different diameters within a single tube can create band gap changes at interfaces where the different diameters meet. Such interfaces thus can be considered to correspond to structures analogous to semiconductor heterostructures. The direct bandgap nature of carbon nanotubes can lead to conduction and valence-band offsets. Since these are nearly symmetric, such can lead to symmetric offsets. Similarly to a semiconductor heterostructure system (Si/Si—Ge; AlGaAs/GaAs; InP/InGaAsP) in IV or III/V column elements, the carbon nanotube structures can lead to dissimilar characteristics due to electronegativity. The carbon nanotube system can be biased appropriately to lead to heating at one end and cooling in another, and can thus become a Peltier cooler (in other words, a thermoelectric cooler). Randomness of carbon nanotube growth can lead to different configurations of nanotubes being present in a single layer, however, such randomness should not be problematic in that literally billions of nanotubes can be easily grown within a single layer, and such can together act as a thermoelectric cooling system.

Figure 18:
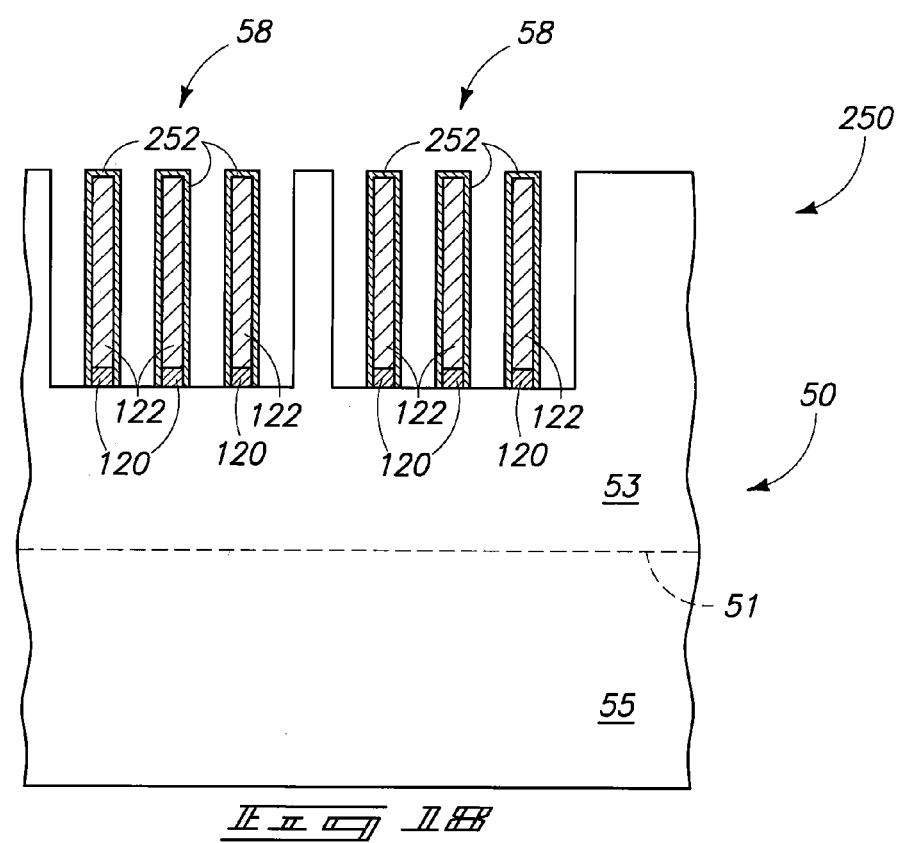
FIG. 18 is a diagrammatic, cross-sectional view of a semiconductor assembly illustrating yet another aspect of the present invention.

FIG. 18 illustrates a further aspect of the present invention. Specifically, FIG. 18 shows a construction 250 having a semiconductor die 50 of the type described previously in this disclosure, and having grooves 58 extending into the die. The construction further comprises carbon nanotubes 122 formed within the grooves and over nanocrystalline seeds 120. Additionally, the construction comprises thermally-conductive coating material 252 surrounding the nanotubes 122. The thermally-conductive coating material can be any appropriate material, and in particular aspects will comprise, consist essentially of, or consist of metal, such as, for example, copper.

The coated nanotubes of FIG. 18 can be utilized in or more of the thermal transfer applications discussed above.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A method of cooling a semiconductor die, comprising:
   providing a semiconductor package comprising a semiconductor die having a frontside surface and a backside surface in opposing relation to the frontside surface, with the backside surface having a plurality of grooves extending therein, the grooves having void regions extending therein; and
   forcing coolant material through the void regions within the grooves.

2. The method of claim 1 further comprising utilization of acoustics to draw thermal energy from the semiconductor die.

3. The method of claim 1 wherein the semiconductor package further comprises a thermally conductive plate over the grooves.

4. The method of claim 1 wherein the semiconductor package further comprises metal lining the grooves.

5. The method of claim 1 wherein the coolant material is a gas.

6. The method of claim 1 wherein the coolant material is a gas, and wherein the forcing the coolant material through the grooves uses a fan to blow the coolant material through the grooves.

7. The method of claim 1 wherein the coolant material is a liquid.

8. The method of claim 1 wherein the coolant material is a liquid, and wherein the forcing of the coolant material through the grooves utilizes capillary action to draw the coolant material through the grooves.

9. A method of cooling a semiconductor die, comprising:
   providing a semiconductor package comprising a semiconductor die having a frontside surface and a backside surface in opposing relation to the frontside surface, with the backside surface having a plurality of grooves extending therein, and wherein metal lines the grooves; the grooves having void regions extending therein; and
   using a fan to blow coolant material through the void regions within the grooves.

* * * * *